(12) United States Patent
Bonhôte et al.

(10) Patent No.: US 9,236,260 B2
(45) Date of Patent: Jan. 12, 2016

(54) SYSTEM, METHOD AND APPARATUS FOR SEEDLESS ELECTROPLATED STRUCTURE ON A SEMICONDUCTOR SUBSTRATE

(75) Inventors: Christian René Bonhôte, San Jose, CA (US); Jeffrey S. Lille, Sunnyvale, CA (US); Ricardo Ruiz, Santa Clara, CA (US); Georges Gibran Siddiqi, San Jose, CA (US)

(73) Assignee: HGST Netherlands B.V. (NL)

( * ) Notice: Subject to any disclaimer, the term of this patent is extended or adjusted under 35 U.S.C. 154(b) by 928 days.

(21) Appl. No.: 13/328,218

(22) Filed: Dec. 16, 2011

(65) Prior Publication Data

US 2013/0154020 A1   Jun. 20, 2013

(51) Int. Cl.
| H01L 21/70 | (2006.01) |
| H01L 21/28 | (2006.01) |
| H01L 29/66 | (2006.01) |
| H01L 29/78 | (2006.01) |
| H01L 21/8238 | (2006.01) |

(52) U.S. Cl.
CPC ........ H01L 21/28052 (2013.01); H01L 29/665 (2013.01); H01L 29/78 (2013.01); *H01L 21/823814* (2013.01); *H01L 21/823828* (2013.01)

(58) Field of Classification Search
CPC ... H01L 21/44; H01L 21/336; H01L 21/8242; H01L 23/48; H01L 3/113; H01L 31/062; H01L 27/108
See application file for complete search history.

(56) References Cited

U.S. PATENT DOCUMENTS

| 5,077,085 | A  | 12/1991 | Schnur et al. |
| 7,190,049 | B2 | 3/2007  | Tuominen et al. |
| 7,341,825 | B2 | 3/2008  | Bandic et al. |
| 7,741,721 | B2 | 6/2010  | Black et al. |
| 7,829,844 | B2 | 11/2010 | Miyata et al. |
| 7,892,956 | B2 | 2/2011  | Deligianni et al. |
| 2002/0043683 | A1* | 4/2002 | Nakagawa et al. ........... 257/315 |
| 2005/0186732 | A1* | 8/2005 | Yun ............................... 438/253 |
| 2006/0024963 | A1* | 2/2006 | Yue et al. ...................... 438/664 |
| 2006/0124467 | A1 | 6/2006 | Ho et al. |
| 2008/0230514 | A1 | 9/2008 | Park et al. |
| 2008/0268280 | A1 | 10/2008 | Cho et al. |
| 2009/0308837 | A1 | 12/2009 | Albrecht et al. |
| 2010/0102029 | A1 | 4/2010 | Schmid et al. |
| 2010/0200899 | A1* | 8/2010 | Marukame et al. ........... 257/295 |
| 2011/0024723 | A1 | 2/2011 | Gradecak et al. |

(Continued)

OTHER PUBLICATIONS

Curry, Michael L. et al., "Electrodeposition of Cobalt Nanowires on H-terminated conductive Si(111) Surfaces using Coblock Polymer Templating," J. Vac. Sci. Technol. A 29(3), May/Jun. 2011, Copyright 2011 American Vacuum Society, 5 pages.

(Continued)

*Primary Examiner* — Kyoung Lee

(57) ABSTRACT

An integrated circuit has a doped silicon semiconductor with regions of insulators and bare silicon. The bare silicon regions are isolated from other bare silicon regions. A semiconductor device on the doped silicon semiconductor has at least two electrical connections to form regions of patterned metal. A metal is electroplated directly on each of the regions of patterned metal to form plated connections without a seed layer. A self-aligned silicide is located under each plated connection, formed by annealing, for the regions of plated metal on bare silicon.

22 Claims, 2 Drawing Sheets

(56) References Cited

U.S. PATENT DOCUMENTS

2011/0151236 A1 6/2011 Bosworth et al.
2011/0303887 A1* 12/2011 Otsuka .............................. 257/1

OTHER PUBLICATIONS

Iwai, Hiroshi et al., "NiSi Salicide Technology for Scaled CMOS", Microelectronic Engineering 60 (2002) 157-169, Copyright 2002 Elsevier Science B.V., 13 pages.

Llona, L.D. Vargas et al., "Seedless Electroplating on Patterned Silicon", J. Micromech. Microeng. 16 (2006), Copyright 2006 IOP Publishing Ltd., 6 pages.

Su, Lisa T. et al., "Optimization of Series Resistance in Sub-0.2 um SOI MOSFETs", Department of Electrical Engineering and Computer Science, Copyright 1993 IEEE, 4 pages.

Thurn-Albrecht, T. et al., "Ultrahigh-Density Nanowire Arrays Grown in Self-Assembled Diblock Copolymer Templates", Dec. 15, 2000, vol. 290, Science, 4 pages.

* cited by examiner

SYSTEM, METHOD AND APPARATUS FOR SEEDLESS ELECTROPLATED STRUCTURE ON A SEMICONDUCTOR SUBSTRATE

BACKGROUND OF THE INVENTION

1. Field of the Disclosure

The present invention generally relates to bulk metal-oxide semiconductor field-effect transistors (MOSFETS) and silicon-on-insulator (SOI) MOSFETs and specifically, a self-aligned silicide (salicide) process for thin film SOI MOSFETs having low resistivity contacts and a self-aligned silicide (salicide) process for shallow junctions.

2. Description of the Related Art

Conventionally, a reduction of a short channel effect in a silicon-on-insulator (SOI) MOSFET has been addressed by using ultra-thin silicon films (e.g., having a thickness substantially within a range of about 50 nm to about 3 nm). However, using an ultra-thin SOI film can result in high source/drain series resistance. A portion of the high source/drain series resistance can be reduced by using a self-aligned silicide (salicide) contact (e.g., for a discussion of salicides, see Lisa T. Su et al., "Optimization of the series resistance in sub-0.2 fim SOI MOSFET's", Electron Device Letters, 15(9), p. 363, September 1994 and U.S. Pat. No. 6,987,050).

The conventional salicide process has been limited to bulk or thick SOI films (e.g., for purposes of this disclosure, a "bulk" or "thick" SOI film is thicker than 100 nm). Reduction of a SOI film thickness to an estimated 10 nm precludes the use of conventional salicide. That is, if the amount of silicon consumed by the formation of the silicide alloy becomes a large portion of the initial SOI film thickness, then the contact area will decrease, leading to an increase in the contact resistance. Further, even if a conventional salicide was used with thin films, there is no guarantee of low parasitic resistance because an ultra-thin silicon film may be completely consumed during the silicide formation. Further, the conventional salicide process can form a metal-rich silicide which is characterized by higher resistance, if there is not enough silicon to complete the reaction that forms the low resistivity silicide phase.

In the case of a thin SOI film, the percentage of the SOI consumed by the silicide considerably affects the series resistance. It has been demonstrated that when 80% or more of the SOI layer is consumed, the series resistance begins to increase as a result of a reduction in the contact area (e.g., see Su et al., supra).

Alternatively, if the silicide layer is made extremely thin (e.g., less than 30 nm) to avoid consuming the thin SOI film, then the silicide layer loses its efficiency in reducing the series resistance. For example, if the silicide is in the thick regime, then a reduction of the silicide thickness would roughly yield a proportional increase in the series resistance. This linear behavior would hold down to about 20 nm (depending on the silicide metal). A thinner silicide film may exhibit nucleation problems and some of the phases may not form. All of this would lead to a very steep increase in the contact resistance.

The series parasitic resistance should be minimized to facilitate the fabrication of high performance thin film SOI MOSFETs. The conventional salicide process is not applicable to the production of ultra-thin SOI MOSFETs, and therefore a new salicide process is required to overcome the problems of the conventional method. Further, the conventional method and structures are deficient in their silicide/SOI interface roughness.

Yet another problem of the conventional structures and methods is associated with shallow junctions used in both bulk and SOI MOSFET structures. That is, shallow junctions provide many benefits when used with the fabrication of submicron MOSFET. For example, they allow for a large punch-through voltage. That is, the lateral spread of the source and drain depletion regions below the surface layer makes a MOSFET more prone to punch-through. Therefore, shallow source and drains effectively suppress subsurface punch-through path.

Additionally, shallow junctions provide better short channel behavior, and in particular less Vr roll-off (e.g., see S. Wolf, Silicon Processing for the VLSI Era, Volume 3—The Submicron MOSFET, Lattice Press, 1995).

Additionally, such shallow junctions allow for steeper junction (dopant) profiles. For example, low energy implants are used to form shallow junctions. The lateral projection range decreases with the implant energy, and therefore more abrupt junctions can be obtained.

To reduce the series resistance to the source and drain, a self-aligned (salicide) process may be used in the fabrication of the MOSFET device. The top surface of the source and drain regions are silicided, by converting some of the superficial Si into silicide phases such as $CoSi_2$, or $TiSi_2$.

The conventional salicide process typically comprises the following process. First, blanket deposition of a metal such as Co, Ti or Ni, is performed. For example, the typical required film thickness for Co is about 8 nm. The Co deposition is followed by a TiN cap deposition of about 20 nm thick, to prevent oxidation during anneals. Then, a first rapid thermal anneal (RTA) is performed to form the CoSi, $TiSi_2$, or NiSi phase. For example, a 525° C. anneal would react the deposited Co with the underlay Si, converting some of the Si into CoSi.

Thereafter, selective etching of the unreacted metal is performed. For example, the Co that was deposited over non-Si surfaces, such as the dielectric sidewall spacers of the device, cannot react with the Si during the anneal, and therefore would not convert into CoSi. The unreacted Co is etched selectively, leaving the CoSi regions intact.

Finally, a second RTA is performed to form the $CoSi_2$ or $TiSi_2$ low resistive phase. For example, the CoSi is annealed at about 750° C., to form the $CoSi_2$ phase. It is noted that the formation of the $CoSi_2$ phase requires additional consumption of Si from the source and drain regions. The $NiSi_2$ phase has a higher resistivity than NiSi. Thus, a second RTA is not applied in the case of nickel. The silicide forms a junction with the source or drain silicon.

The location of the Silicide/Si junction plays a significant role. At the junction of the contact and the silicon, there is a potential barrier referred to as the Schottky barrier. The Schottky barrier is not desirable, since it leads to a rectifying contact. For example, the Schottky barrier height of $CoSi_2$ on n-type silicon is about 0.64 eV. If the silicon doping is made very high (e.g., such as $5\times10^{19}$ cm-3), the potential barrier narrows, and electrons can easily tunnel through the thin barrier into the semiconductor. The contact is then referred to as a "tunneling contact", which performs as an ohmic contact.

Referring to the structure 17 in FIG. 1, to make a good ohmic contact to the source 19a and drain 19b, the silicide/Si junction should form at the peak concentration of the dopants in the source 19a and drain 19b. In addition, the silicide/Si junction should not be deeper than the source/drain junction depth, or otherwise a leakage path may form.

Combining the shallow junction requirement with the requirements associated with the silicide/Si junction position is not trivial. As explained above, the salicide process converts some of the source and drain silicon into silicide. For example, the silicon film thickness that is consumed in the formation of CoSi$_2$ alloy is about 3.64 times thicker than the initial as-deposited Co film.

A Co film of 8 nm thickness would yield a CoSi$_2$ film of about 28 nm, and would consume about 29 nm of silicon. On the other hand, the source and drain junction depth is projected to be about 20 nm for devices with a 100 nm gate length (e.g., see the International Technology Roadmap for Semiconductors, 1999 Edition, Semiconductor Industry Association, Executive Summary).

As may be seen by this example, if the junction is made very shallow as required by the semiconductor road map, the silicide film thickness, X silicide, and therefore the silicide/Si junction position, may even exceed the source/drain junction depth. Since the silicide film cannot be made thinner, due to the resistance constraint, the conventional salicide process must be modified to accommodate the shallow junction technology requirement.

In the example of FIG. 1A, the integrated circuit (IC) has a semiconductor 11 with regions of insulators 13 and bare silicon 15. The IC may comprise a complementary metal-oxide semiconductor (CMOS). The bare silicon regions are isolated from other bare silicon regions. A semiconductor device 17 is located on the semiconductor 11. The semiconductor device has source 19a and drain 19b to form regions of patterned metal. As shown in FIG. 1B, an oxide spacer 21 is formed on the sidewalls of the device 17. In FIG. 1C, a layer 23 of metal is deposited on the entire device as a seed layer. The device 17 is then annealed (FIG. 1D) to form self-aligned silicides 25 (i.e., salicide) under the seed layer 23. Finally (FIG. 1E), any unreacted metal and by products are removed.

The ability to make large arrays of metal on silicon could provide vertical vias, hard masks for vertical etching, or even single electron transistors given the size and spacing of these arrays of metal clusters. In addition, by not having the constraint of a seed layer, wires or interconnects also may be plated. Thus, improvements in electroplating metals for semiconductor applications continue to be of interest.

The embodiments disclosed herein differ from known semiconductor devices in at least two ways. First, embodiments of solutions disclosed herein may comprise vertical transistors rather than conventional lateral transistors. Second, conventional solutions use a material to form the gate completely from block copolymers. In contrast, the embodiments disclosed herein form at least the source and drain contacts, but do not engineer the gate insulation material.

SUMMARY

Embodiments of a system, method and apparatus for an integrated circuit are disclosed. The circuit may comprise a doped silicon semiconductor having regions of insulators and bare silicon, the bare silicon regions are isolated from other bare silicon regions; a semiconductor device on the doped silicon semiconductor, the semiconductor device having at least two electrical connections to form regions of patterned metal; a metal electroplated directly on each of the regions of patterned metal to form plated connections without a seed layer; and a self-aligned silicide under each plated connection, formed by annealing, for the regions of plated metal on bare silicon.

In other embodiments, a method of forming a seedless electroplated metal on a semiconductor surface may comprise providing a silicon substrate; forming a mask directly on the silicon substrate without a seed layer, the mask having a thickness of less than 100 nm, and the mask having openings with widths that are less than 100 nm; wherein the substrate is masked in regions of insulators and silicon regions, and the silicon regions are isolated from other silicon regions; coating the substrate with a polymer that is compatible with a block copolymer (BCP) to allow the BCP to produce a desired mask pattern, the BCP chemically bonds to the substrate at locations of the silicon regions, the polymer having equal chemical affinity to different constituents of the BCP, and the BCP forming the desired mask pattern via phase separation, and the desired mask pattern has part of the BCP removed to expose the substrate; removing an oxide on the silicon substrate with buffered oxide etch (BOE) containing a surfactant; and electroplating a metal through the mask to form electrical connections on the silicon substrate, and the silicon substrate acts as a cathode to form plated electrical connections.

The foregoing and other objects and advantages of these embodiments will be apparent to those of ordinary skill in the art in view of the following detailed description, taken in conjunction with the appended claims and the accompanying drawings.

BRIEF DESCRIPTION OF THE DRAWINGS

So that the manner in which the features and advantages of the embodiments are attained and can be understood in more detail, a more particular description may be had by reference to the embodiments thereof that are illustrated in the appended drawings. However, the drawings illustrate only some embodiments and therefore are not to be considered limiting in scope as there may be other equally effective embodiments.

The use of the same reference symbols in different drawings indicates similar or identical items.

DETAILED DESCRIPTION

Figure 1A:
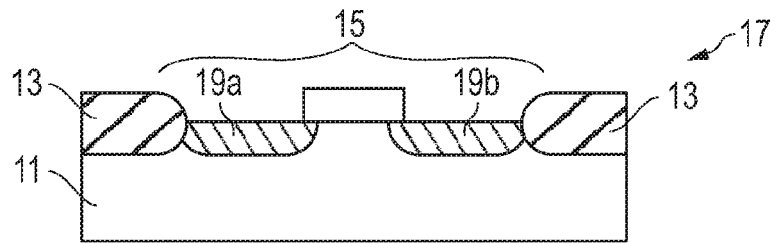
FIGS. 1A-1E are schematic sectional side views of an embodiment of a method of forming integrated circuits.
Figure 1B:
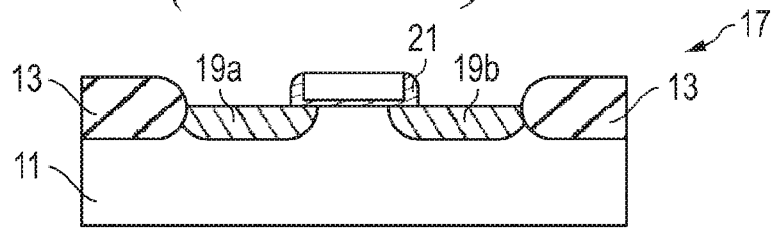
Figure 1C:
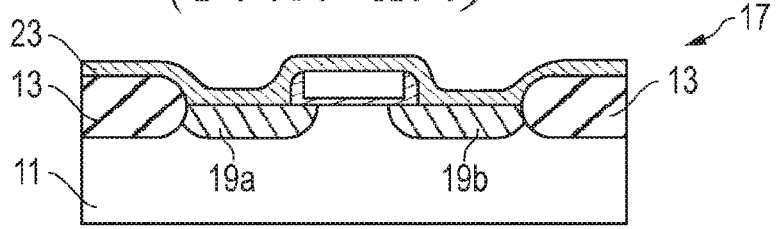
Figure 1D:
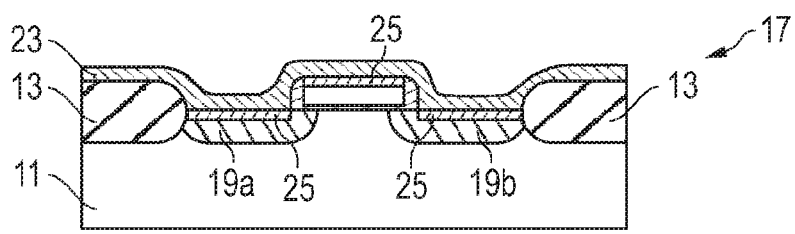
Figure 1E:
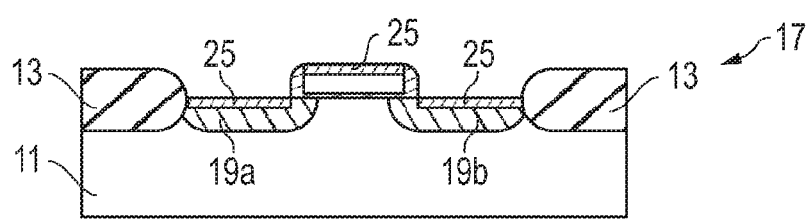

Self-assembling block copolymers have been proposed for creating periodic nanometer (nm) scale features. A self-assembling block copolymer typically contains two or more different polymeric block components, for example components A and B, that are immiscible with one another. Under suitable conditions, the two or more immiscible polymeric block components separate into two or more different phases or microdomains on a nanometer scale and thereby form ordered patterns of isolated nano-sized structural units. There are many types of block copolymers that can be used for forming the self-assembled periodic patterns. If one of the components A or B is selectively removable without having to remove the other, then an orderly arranged structural unit of the un-removed component can be formed.

Specific examples of suitable block copolymers that can be used for forming the self-assembled periodic patterns include, but are not limited to: poly(styrene-block-methyl methacrylate) (PS-b-PMMA), poly(ethylene oxide-block-isoprene) (PEO-b-PI), poly(ethylene oxide-block-butadiene) (PEO-b-PBD), poly(ethylene oxide-block-styrene) (PEO-b-PS), poly(ethylene oxide-block-methylmethacrylate) (PEO-b-PMMA), poly(ethyleneoxide-block-ethylethylene) (PEO-b-PEE), poly(styrene-block-vinylpyridine) (PS-b-PVP), poly(styrene-block-isoprene) (PS-b-PI), poly(styrene-block-butadiene) (PS-b-PBD), poly(styrene-block-ferrocenyldimethylsilane) (PS-b-PFS), poly(butadiene-block-vinylpyridine) (PBD-b-PVP), poly(isoprene-block-methyl methacrylate) (PI-b-PMMA), and poly(styrene-block-dymethylsiloxane) (PS-b-PDMS).

The specific self-assembled periodic patterns formed by the block copolymer are determined by the molecular volume ratio between the first and second polymeric block components A and B. When the ratio of the molecular volume of the second polymeric block component B over the molecular volume of the first polymeric block component A is less than about 80:20 but greater than about 60:40, the block copolymer will form an ordered array of cylinders composed of the first polymeric block component A in a matrix composed of the second polymeric block component B. When the ratio of the molecular volume of the first polymeric block component A over the molecular volume of the second polymeric block component B is less than about 60:40 but is greater than about 40:60, the block copolymer will form alternating lamellae composed of the first and second polymeric block components A and B. The unremoved component is to be used as an etch mask, so ordered arrays of alternating lamellae and alternating cylinders are of interest.

The periodicity or bulk period ($L_0$) of the repeating structural units in the periodic pattern is determined by intrinsic polymeric properties such as the degree of polymerization N and the Flory-Huggins interaction parameter $\chi$. $L_0$ scales with the degree of polymerization N, which in turn correlates with the molecular weight M. Therefore, by adjusting the total molecular weight of the block copolymer of the present invention, the bulk period ($L_0$) of the repeating structural units can be selected.

To form the self-assembled periodic patterns, the block copolymer is first dissolved in a suitable solvent system to form a block copolymer solution, which is then applied onto a surface to form a thin block copolymer layer, followed by annealing of the thin block copolymer layer, which causes phase separation between the different polymeric block components contained in the block copolymer. The solvent system used for dissolving the block copolymer and forming the block copolymer solution may comprise any suitable non-polar solvent, including, but not limited to: toluene, propylene glycol monomethyl ether acetate (PGMEA), propylene glycol monomethyl ether (PGME), and acetone.

The block copolymer solution can be applied to the substrate surface by any suitable techniques, including, but not limited to: spin casting, coating, spraying, ink coating, dip coating, etc. Preferably, the block copolymer solution is spin cast onto the substrate surface to form a thin block copolymer layer. After application of the thin block copolymer layer onto the substrate surface, the entire substrate is annealed to effectuate microphase segregation of the different block components contained by the block copolymer, thereby forming the periodic patterns with repeating structural units.

The block copolymer films in the above-described techniques self-assemble without any direction or guidance. This undirected self-assembly results in patterns with defects so it is not practical for applications that require long-range ordering, such as for making annular bands of radial lines on a master disk for nanoimprinting patterned-media disks. However, directed or guided self-assembly of a block copolymer to form patterns of generally radial lines and/or generally concentric rings of one of the block copolymer components is described in U.S. Pat. No. 7,976,715 B2, assigned to the same assignee as this application. More generally, one can use the chemical interaction between a polymer intermediate layer (e.g., a brush layer) to allow the BCP to phase separate in the desired location on the substrate in the desired phase-segregated pattern. This intermediate layer is typically applied to the substrate before the BCP. Furthermore, the intermediate layer may also be patterned by previous masking and etching steps. See, e.g., *Precise Control over Molecular Dimensions of Block-Copolymer Domains Using the Interfacial Energy of Chemically Nanopatterned Substrates* Advanced Materials Volume 16, Issue 15, pages 1315-1319, August 2004. This document is incorporated herein by reference in its entirety.

Figure 2A:
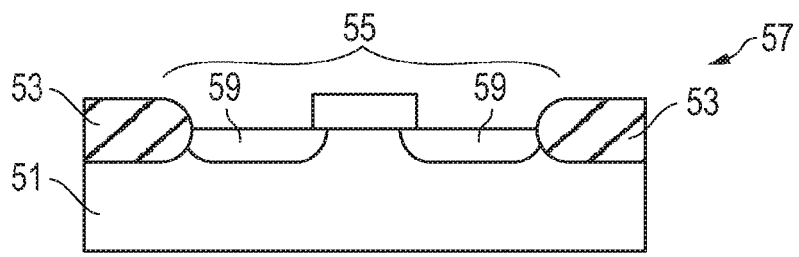
FIGS. 2A-2D are schematic sectional side views of an embodiment of a method of forming integrated circuits.

Referring to FIG. 2A, an integrated circuit (IC) may comprise a doped silicon semiconductor 51 having regions of insulators 53 and bare silicon 55. For example, the IC may comprise a complementary metal-oxide semiconductor (CMOS). The bare silicon regions are isolated from other bare silicon regions. A semiconductor device 57 is located on the doped silicon semiconductor 51. The semiconductor device 57 may comprise a plurality of semiconductor devices on a phase change memory or flash memory.

Figure 2B:
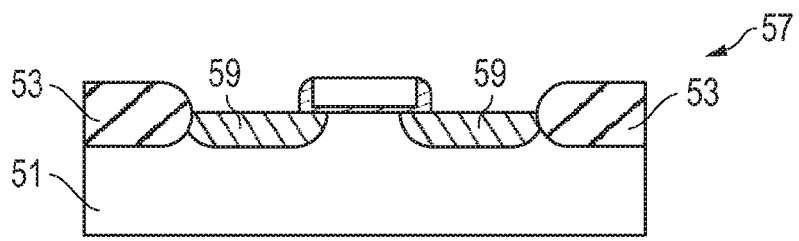
Figure 2C:
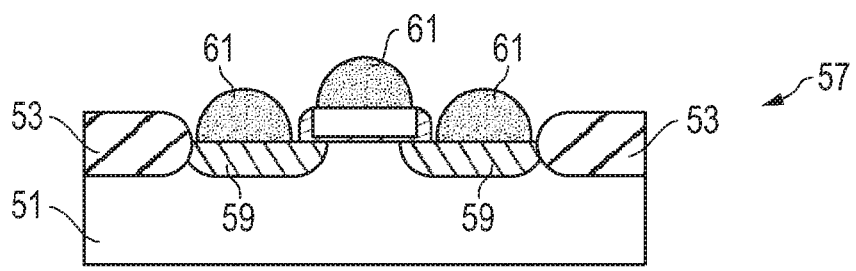

The semiconductor device 57 may have at least two electrical connections 59 to form regions of patterned metal. In some embodiments, the electrical connections may comprise metal wires or vias. The electrical connections 59 may comprise at least one of a source, a drain, and a gate connection. In FIG. 2B, an oxide spacer 60 is formed on the sidewalls of the device 57. As shown in FIG. 2C, a metal 61 may be electroplated directly on each of the regions of patterned metal 61 to form plated connections without a seed layer. For example, the electroplated metal 61 may comprise Ni, Co, Ta, Ti, Mo or combinations thereof.

Figure 2D:
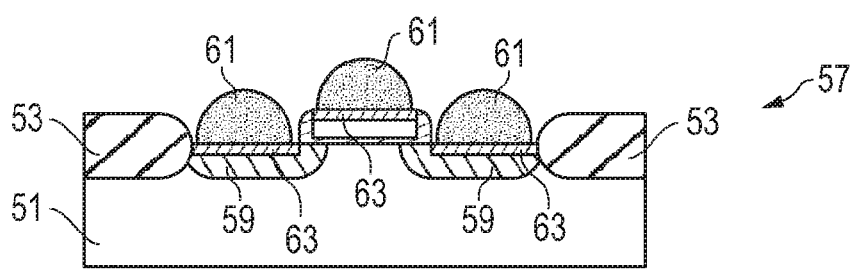

In addition (FIG. 2D), a self-aligned silicide 63 (i.e., salicide) may be located under each plated connection 61. This self-aligned silicide 63 may be formed by a process step of annealing, for the regions of plated metal on bare silicon. For example, the self-aligned silicide may comprise $NiSi_x$, $CoSi_x$, $TaSi_x$, $TiSi_x$, $MoSi_x$ or combinations thereof. The IC may further comprise a coating on the substrate with a chemically-neutral polymer. The chemically-neutral polymer may be removed by etching with an oxygen-containing plasma. The IC may further comprise mask and etch to break the plated connections formed by electroplating the metal.

Other embodiments may comprise a method of forming a seedless electroplated metal on a semiconductor surface. For example, the method may comprise providing a silicon substrate; forming a mask directly on the silicon substrate without a seed layer, the mask having a thickness of less than 100 nm, or less than 50 nm, and the mask having openings with widths that are less than 100 nm.

The substrate may be masked in regions of insulators and silicon regions, and the silicon regions are isolated from other silicon regions. The substrate may be coated with a polymer that is compatible with a block copolymer (BCP) to allow the BCP to produce a desired mask pattern. The BCP may form the desired mask pattern via phase separation into either lamella or a hexagonally closed packed arrangement. The BCP may comprise a tri-block copolymer, a silicon-containing polymer, or layers of poly(styrene-random-methyl methacrylate) (PS-r-PMMA) and poly(styrene-block-methyl methacrylate) (PS-b-PMMA).

The BCP chemically bonds to the substrate at locations of the silicon regions, the polymer having equal chemical affinity to different constituents of the BCP, and the BCP forming the desired mask pattern via phase separation, and the desired mask pattern has part of the BCP removed to expose the substrate; removing an oxide on the silicon substrate with buffered oxide etch (BOE) containing a surfactant. Removing the oxide may comprise about 1 minute to about 15 minutes in BOE containing the surfactant. The method may also comprise electroplating a metal through the mask to form electrical connections on the silicon substrate, and the silicon substrate acts as a cathode to form plated electrical connections.

The method may further comprise coating the substrate with a chemically-neutral polymer, and removing the chemically-neutral polymer by etching with an oxygen-containing plasma. In addition, the method may further comprise additional mask and etching steps to break the plated electrical connections formed by electroplating the metal, and/or annealing to form a self-aligned silicide with the plated electrical connections.

The embodiments disclosed herein are well suited for semiconductor applications. For example, semiconductor applications are sensitive to conventional manufacturing methods that require the use of electric fields during fabrication. Insulating gate layers (e.g., 0.7 nm of $SiO_2$, 1 nm of $HfO_2$, etc.), may be formed on the substrate and would be prone to damage from electrostatic discharge (ESD). Thus, embodiments of the BCP formation methods disclosed herein offer semiconductor applications a considerable advantage over prior art techniques.

The embodiments disclosed herein have numerous advantages. Starting with a partially-conductive substrate (e.g., doped silicon), patterns may be formed without a seed layer. The mask material may comprise a polymer mask such as a BCP. After the BCP is formed, a metal is electroplated into the BCP film. The metal may be less than 50 nm thick. After the metal is plated, a high bias RIE etch transfers the image into the conductive substrate. Such embodiments also provide a method to prepare the substrate for reliable plating and removal of the masking layer. The plated layer may have a granular appearance since plating begins as many, closely-spaced nucleation sites that may cause a roughness of the nanometer scale.

These advantages eliminate the need to put down and remove a seed layer. Semiconductors applications are particularly well suited for this solution since semiconductor surfaces are very sensitive to the seed layer addition and removal processes. Electroplating is an inherently low-energy additive process that overcomes these limitations.

This written description uses examples to disclose the embodiments, including the best mode, and also to enable those of ordinary skill in the art to make and use the invention. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciate that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A method of forming a seedless electroplated metal on a semiconductor surface, comprising:
   providing a silicon substrate;
   forming a mask directly on the silicon substrate without a seed layer, the mask having a thickness of less than 100 nm, and the mask having openings with widths that are less than 100 nm; wherein
   the substrate is masked in regions of insulators and regions of silicon, and the silicon regions are isolated from other silicon regions;
   coating the substrate with a polymer that is compatible with a block copolymer (BCP) to allow the BCP to produce a desired mask pattern, the BCP chemically bonds to the substrate at locations of the silicon regions, the polymer having equal chemical affinity to different constituents of the BCP, and the BCP forming the desired mask pattern via phase separation, and the desired mask pattern has part of the BCP removed to expose the substrate;
   removing an oxide on the silicon substrate with buffered oxide etch (BOE) containing a surfactant; and
   electroplating a metal through the mask to form electrical connections on the silicon substrate, and the silicon substrate acts as a cathode to form plated electrical connections.

2. A method according to claim 1, wherein the mask thickness is 50 nm or less.

3. A method according to claim 1, wherein the electrical connections comprise metal wires or vias.

4. A method according to claim 1, wherein the BCP forms the desired mask pattern via phase separation into either lamella or a hexagonally closed packed arrangement.

5. A method according to claim 1, wherein the BCP comprises a tri-block copolymer.

6. A method according to claim 1, wherein the BCP comprises a silicon-containing polymer.

7. A method according to claim 1, wherein the BCP comprises layers of poly(styrene-random-methyl methacrylate) (PS-r-PMMA) and poly(styrene-block-methyl methacrylate) (PS-b-PMMA).

8. A method according to claim 1, further comprising coating the substrate with a chemically-neutral polymer, and removing the chemically-neutral polymer by etching with an oxygen-containing plasma.

9. A method according to claim 1, wherein removing the oxide comprises about 1 minute to about 15 minutes in BOE containing the surfactant.

10. A method according to claim 1, further comprising additional mask and etching steps to break the plated electrical connections formed by electroplating the metal.

11. A method according to claim 1, further comprising annealing to form a self-aligned silicide with the plated electrical connections.

12. An integrated circuit (IC), comprising:
a doped silicon semiconductor having a coating with a chemically-neutral polymer, and the chemically-neutral polymer is removed by etching with an oxygen-containing plasma, the doped silicon semiconductor comprising a memory device having regions of insulators and regions of bare silicon, the bare silicon regions are isolated from other bare silicon regions;
a plurality of semiconductor devices on the doped silicon semiconductor, each of the semiconductor devices having at least two electrical connections comprising metal wires or vias to form regions of patterned metal, said at least two electrical connections comprise at least one of a source, a drain, and a gate connection;
a metal electroplated directly on each of the regions of patterned metal to form plated connections without a seed layer; and
a self-aligned silicide under each plated connection, formed by annealing, for the regions of plated metal on bare silicon.

13. An IC according to claim 12, wherein the IC is a complementary metal-oxide semiconductor (CMOS).

14. An IC according to claim 12, wherein the electroplated metal comprises Ni, Co, Ta, Ti, Mo or combinations thereof.

15. An IC according to claim 12, wherein the self-aligned silicide comprises $NiSi_x$, $CoSi_x$, $TaSi_x$, $TiSi_x$, $MoSi_x$ or combinations thereof.

16. An IC according to claim 12, wherein the plurality of semiconductor devices are on a phase change memory or flash memory.

17. An IC according to claim 12, further comprising mask and etch to break the plated connections formed by electroplating the metal.

18. An integrated circuit (IC), comprising:
a doped silicon semiconductor comprising a memory device having regions of insulators and regions of bare silicon, the bare silicon regions are isolated from other bare silicon regions;
a plurality of semiconductor devices on the doped silicon semiconductor, each of the semiconductor devices having at least two electrical connections comprising metal wires or vias to form regions of patterned metal, said at least two electrical connections comprise at least one of a source, a drain, and a gate connection;
a metal electroplated directly on each of the regions of patterned metal to form plated connections without a seed layer, and a mask and etch to break the plated connections formed by electroplating the metal; and
a self-aligned silicide under each plated connection, formed by annealing, for the regions of plated metal on bare silicon.

19. An IC according to claim 18, wherein the IC is a complementary metal-oxide semiconductor (CMOS).

20. An IC according to claim 18, wherein the electroplated metal comprises Ni, Co, Ta, Ti, Mo or combinations thereof.

21. An IC according to claim 18, wherein the self-aligned silicide comprises $NiSi_x$, $CoSi_x$, $TaSi_x$, $TiSi_x$, $MoSi_x$ or combinations thereof.

22. An IC according to claim 18, wherein the plurality of semiconductor devices are on a phase change memory or flash memory.

* * * * *